United States Patent
Cho et al.

(10) Patent No.: US 12,120,896 B2
(45) Date of Patent: Oct. 15, 2024

(54) TRANSPARENT CONDUCTIVE FILM

(71) Applicant: BASF Coatings GmbH, Münster (DE)

(72) Inventors: Boram Cho, Basel (CH); Jean-Charles Flores, Rixheim (FR); Michael Reinke, Basel (CH); Myung Mo Sung, Seoul (KR); Jin Won Jung, Seoul (KR)

(73) Assignee: BASF COATINGS GMBH, Muenster (DE)

( * ) Notice: Subject to any disclaimer, the term of this patent is extended or adjusted under 35 U.S.C. 154(b) by 704 days.

(21) Appl. No.: 17/257,398

(22) PCT Filed: Jul. 3, 2019

(86) PCT No.: PCT/EP2019/067821
§ 371 (c)(1),
(2) Date: Dec. 31, 2020

(87) PCT Pub. No.: WO2020/007900
PCT Pub. Date: Jan. 9, 2020

(65) Prior Publication Data
US 2021/0269917 A1  Sep. 2, 2021

(30) Foreign Application Priority Data

Jul. 5, 2018 (EP) .................... 18181981

(51) Int. Cl.
*H10K 30/82* (2023.01)
*C23C 16/455* (2006.01)
*C23C 28/00* (2006.01)
*C23C 28/02* (2006.01)
*H10K 30/00* (2023.01)

(52) U.S. Cl.
CPC ....... *H10K 30/82* (2023.02); *C23C 16/45531* (2013.01); *C23C 28/02* (2013.01); *C23C 28/30* (2013.01); *C23C 28/322* (2013.01); *C23C 28/3455* (2013.01); *C23C 28/42* (2013.01); *C23C 28/44* (2013.01); *H10K 30/451* (2023.02); *Y10T 428/31678* (2015.04)

(58) Field of Classification Search
None
See application file for complete search history.

(56) References Cited

U.S. PATENT DOCUMENTS

| 4,645,714 A * | 2/1987 | Roche ............... F24S 40/40 428/458 |
| 5,523,585 A | 6/1996 | Nakamura |
| 2007/0298265 A1* | 12/2007 | Morimoto ......... B32B 17/10018 428/432 |
| 2009/0109537 A1* | 4/2009 | Bright ............... G02B 5/287 359/588 |
| 2011/0212336 A1* | 9/2011 | Kawamoto ......... H05K 9/0096 204/192.15 |
| 2011/0281092 A1* | 11/2011 | Ryu ............... B32B 27/285 428/212 |
| 2012/0125660 A1* | 5/2012 | Bright ............... C03C 17/366 427/108 |
| 2012/0127578 A1* | 5/2012 | Bright ............... G02B 1/116 359/585 |
| 2017/0121812 A1* | 5/2017 | Sung ............... H10K 85/324 |
| 2018/0240991 A1* | 8/2018 | Moriwaki ......... H10K 50/816 |

FOREIGN PATENT DOCUMENTS

| EP | 1849594 A1 | 10/2007 | |
| JP | 2016/012555 A * | 1/2016 | ............ B32B 15/04 |
| WO | 2011099858 A1 | 8/2011 | |
| WO | WO-2015188992 A1 * | 12/2015 | ............... B05D 1/60 |
| WO | WO-2016144869 A1 * | 9/2016 | ............ C03B 17/06 |

OTHER PUBLICATIONS

Okawa—JP 2016-012555 A—PCT D3—MT—multiple metal+oxide layers—2016 (Year: 2016).*
European Search Report for EP Patent Application No. 18181981.4, Issued on Oct. 4, 2018, 3 pages.
International Search Report and Written Opinion for corresponding PCT/EP2019/067821 mailed Oct. 2, 2019, 9 pages.

* cited by examiner

*Primary Examiner* — John Vincent Lawler
(74) *Attorney, Agent, or Firm* — Armstrong Teasdale LLP

(57) ABSTRACT

Described herein is a transparent conductive film including
(a) a first laminate including
at least two layers containing $TiO_2$, $ZrO_2$ or $HfO_2$, and
a layer containing an organic compound in between the two layers containing $TiO_2$, $ZrO_2$ or $HfO_2$,
(b) a metal layer, and
(c) a second laminate including
at least two layers containing ZnO,
a layer containing an organic compound between the two layers containing ZnO, and
a metallic dopant other than zinc.

12 Claims, No Drawings

TRANSPARENT CONDUCTIVE FILM

CROSS-REFERENCE TO RELATED APPLICATIONS

This application is a U.S. National Phase Application of International Patent Application No. PCT/EP2019/067821, filed Jul. 3, 2019, which claims the benefit of priority to European Patent Application No. 18181981.4, filed Jul. 5, 2018, the entire contents of which are hereby incorporated by reference herein.

The present invention is in the field of transparent conductive films, in particular organic-inorganic hybrid transparent conductive films.

Transparent conductive films are widely used as electrodes in opto-electronic devices, such as solar cells or light-emitting diodes. Typically, indium-tin oxide (ITO) is used as material in conductive films. However, ITO films are brittle and thus have limited applicability for flexible devices. Superlattice structures offer an alternative.

U.S. Pat. No. 5,523,585 discloses a superlattice structure formed by periodically repeating, in the direction of electron movement, a first and a second semiconductor material region. However, the conductivity and the flexibility is limited.

US 2011/0 212 336 A1 discloses an electroconductive laminate with high electrical conductivity. However, this laminate is brittle and thus sensitive towards bending.

JP 2016/012 555 A disclose transparent conductive films which are said to be flexible. However, the metal oxides used are brittle, so bending around small radii is not possible without cracks.

US 2017/0 121 812 A1 discloses an organic-inorganic superlattice for moisture and oxygen barrier applications. However, it is not indicated how transparent conductive films are obtained from this approach.

It was an object of the present invention to provide a transparent conductive film which maintains its conductivity after bending. It was further aimed at a process for making these films which is easy and reliably yields films of high quality.

These objects were achieved by a transparent conductive film comprising
   (a) a first laminate comprising
      at least two layers containing $TiO_2$, $ZrO_2$ or $HfO_2$ and
      a layer containing an organic compound in between the two layers containing $TiO_2$, $ZrO_2$ or $HfO_2$
   (b) a metal layer, and
   (c) a second laminate comprising
      at least two layers containing ZnO and
      a layer containing an organic compound between the two layers containing ZnO
      a metallic dopant other than zinc.

The present invention further relates to a process for preparing a transparent conductive film comprising depositing on a substrate
   (a) a first laminate comprising
      at least two layers containing $TiO_2$, $ZrO_2$ or $HfO_2$ and
      a layer containing an organic compound in between the two layers containing $TiO_2$, $ZrO_2$ or $HfO_2$
   (b) a metal layer, and
   (c) a second laminate comprising
      at least two layers containing ZnO and
      a layer containing an organic compound between the two layers containing ZnO
      a metallic dopant other than zinc.

The present invention further relates to the use of the film according to the present invention as electrode in an opto-electronic device.

Preferred embodiments of the present invention can be found in the description and the claims. Combinations of different embodiments fall within the scope of the current invention.

The film according to the present invention is transparent. Transparent in the present context means that the conductive metal oxide film transmits at least 50% of the intensity of light at a wavelength of 550 nm shined on the film parallel to the surface normal, more preferably at least 70%, in particular at least 80%.

The film according to the present invention is conductive, which means that the film is electrically conductive. Preferably, the film has a sheet resistance of 1 000Ω/sq or less, more preferably 500Ω/sq or less, even more preferably 200Ω/sq or less, in particular 100Ω/sq or less. Preferably, the film has a resistivity of 0.01 Ω·cm or less, more preferably $3 \cdot 10^{-3}$ Ω·cm or less, even more preferably $10^{-3}$ Ω·cm or less, in particular $3 \cdot 10^{-4}$ Ω·cm or less. Both the sheet resistance and the resistivity are usually measured at a temperature of 20° C. Preferably, the sheet resistance and the resistivity of the films are measured using the four-point-probe technique.

The film according to the present invention comprises a first laminate comprising layers containing $TiO_2$, $ZrO_2$ or $HfO_2$, preferably $TiO_2$. Preferably, these layers contain at least 50 wt.-% $TiO_2$, $ZrO_2$ or $HfO_2$, more preferably at least 70 wt.-% $TiO_2$, $ZrO_2$ or $HfO_2$, in particular at least 90 wt. % $TiO_2$, $ZrO_2$ or $HfO_2$. The layer containing $TiO_2$, $ZrO_2$ or $HfO_2$ can be amorphous, partially crystalline or crystalline, preferably it is crystalline. The at least two layers containing $TiO_2$, $ZrO_2$ or $HfO_2$ can have the same thickness or different thicknesses, preferably they have the same thickness. The layer containing $TiO_2$, $ZrO_2$ or $HfO_2$ preferably has a thickness of 0.1 to 100 nm, more preferably 1 to 10 nm, in particular 2 to 5 nm. Preferably, the layer containing $TiO_2$, $ZrO_2$ or $HfO_2$ has a uniform thickness, which means that the thickness at the thickest position of the layer is less than double of the thickness at the thinnest position, more preferably less than 1.5 the thickness at the thinnest position. The film according to the present invention comprises at least two layers containing $TiO_2$, $ZrO_2$ or $HfO_2$, preferably at least three, more preferably at least five, in particular at least ten.

The first laminate further comprises a layer containing an organic compound. If the film comprises more than two layers containing $TiO_2$, $ZrO_2$ or $HfO_2$, the film preferably comprises alternatingly a layer containing $TiO_2$, $ZrO_2$ or $HfO_2$ and a layer containing an organic compound, such that each layer containing an organic molecule is in between two layers containing $TiO_2$, $ZrO_2$ or $HfO_2$, wherein other layers may be in between these layers. The layer containing an organic compound is preferably thinner than the layer containing $TiO_2$, $ZrO_2$ or $HfO_2$. If more than one layer containing an organic compound is present, they can have the same thickness or a different one, preferably they have the same thickness. The layer containing an organic compound preferably has a thickness of 0.05 to 5 nm, more preferably 0.1 to 1 nm. The layer containing an organic compound can be a monolayer, i.e. having a thickness on the order of one molecule, or a sub-monolayer.

The layer containing an organic compound preferably contains more than 98 wt.-% of nonmetals, preferably more than 99 wt.-%, in particular completely or essentially completely. It is even more preferable that the nonmetals are C, H, O, N, S, Se and/or P. The layer containing an organic compound can contain one organic compound or more than one organic compounds, for example two or three. The layer containing an organic compound preferably contains a sulfur-containing compound. The sulfur in the sulfur-containing compound is preferably in the oxidation state −2, −1 or 0, which is minus two, minus one or zero, e.g. an organic thiol, an organic thioether, or an organic dithioether. An organic thiol is preferred. The sulfur-containing compound can contain one or more than one sulfur atoms. Preferably, the sulfur-containing compound contains one sulfur atom. More preferably, the sulfur-containing compound is an aromatic thiol. The thiol can be directly bond to the aromatic part of the molecule or via a linker such as a methylene group, preferably it is directly bond to the aromatic group. The sulfur-containing compound is even more preferably a thiophenol derivative. Preferably, the sulfur-containing molecule further contains one or more hydroxyl groups. Some preferred examples for sulfur-containing compounds are given below.

C-1
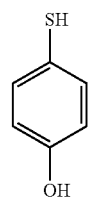

C-2
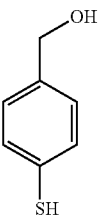

C-3
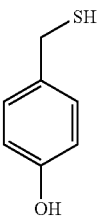

C-4
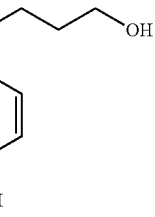

C-5
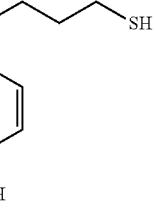

-continued

C-6
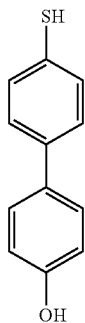

C-7
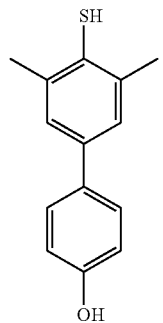

C-8
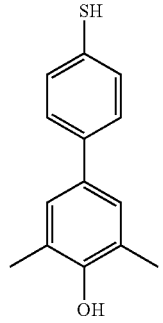

C-9
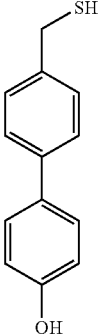

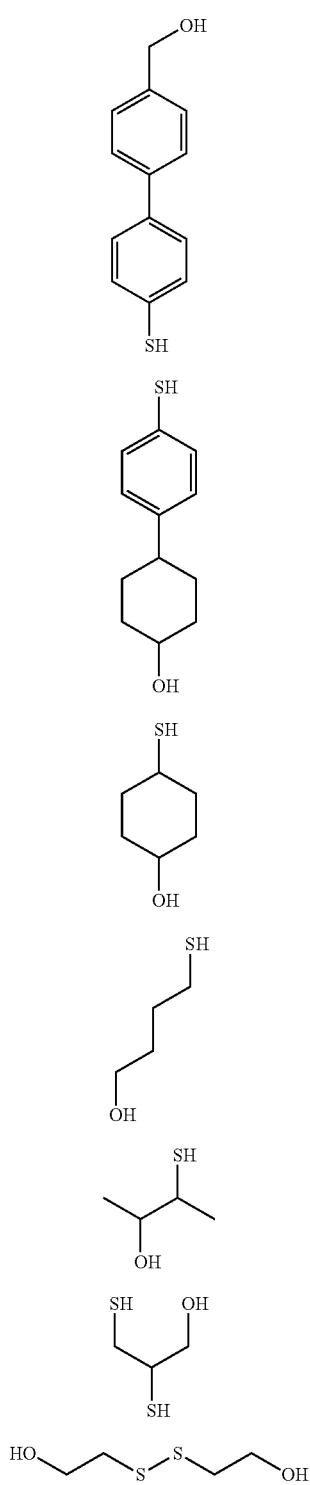

independent of each other parts of function groups as described above. Thiols are preferred, dithiols are more preferred. Preferably, two thiol groups are attached to an aromatic system, such as benzene, either directly or via a linker such as a methylene group. Some preferred examples for sulfur-containing compounds containing two sulfur atoms are given below.

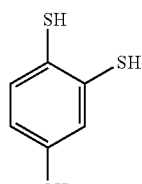
C-20

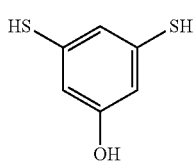
C-21

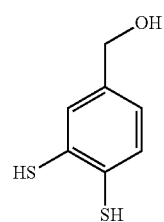
C-22

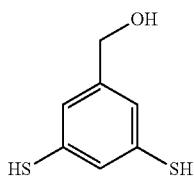
C-23

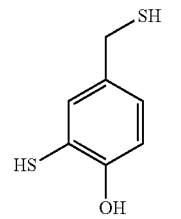
C-24

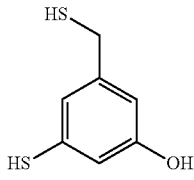
C-25

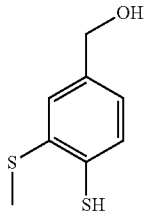
C-26

Particularly preferred are 4-mercaptophenol (C-1), 4-mercaptobenzylic alcohol (C-2) and 2,3-dimercaptopropanol (C-15). It is also possible to make the organic layer with different organic molecules with the provision that at least one organic molecule is sulfur-containing.

Preferably, the sulfur-containing compound contains at least two sulfur atoms, more preferably two sulfur atoms. The sulfur atoms in the sulfur-containing compound are

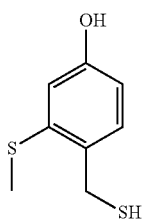

C-27

If the organic compound in the layer containing an organic compound contains hydroxy, thiol or other groups which can be deprotonated, it is possible that the group remains protonated or that it is deprotonated and coordinates to a metal, or that some are protonated and some are deprotonated and coordinate to a metal.

The first laminate has a high relative permittivity. Preferably, the relative permittivity at room temperature and 1 MHz is at least 10, more preferably at least 20, in particular at least 50. The thickness of the first laminate is preferably 2 to 60 nm, more preferably 5 to 40 nm, in particular to 30 nm.

The film according to the present invention further comprises a metal layer. The metal layer can contain Li, Be, Na, Mg, Al, K, Ca, Sc, Ti, V, Cr, Mn, Fe, Co, Ni, Cu, Ga, Rb, Sr, Y, Zr, Nb, Mo, Tc, Ru, Rh, Pd, Ag, Cd, In Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, TI, Bi. Preferably, the metal layer contains Al, Cu, Ag, Au, in particular Ag. The film can contain one metal or more than one, for example two or three. The metal layer has metallic conductivity, preferably at least $10^5$ S/m, more preferably at least $10^6$ S/m, in particular at least $10^7$ S/m. It is possible that there are other layers in between the metal layer and the first laminate. Preferably, however, the metal layer is in contact with the first laminate. The metal layer is sufficiently thin to allow transmission of visible light, preferably the metal layer has a thickness of 1 to 100 nm, more preferably 2 to 50 nm, even more preferably 3 to 30 nm, in particular 5 to 20 nm, for example 8 to 15 nm, such as 10 nm.

The film according to the present invention comprises a second laminate containing at least two layers containing ZnO, i.e. zinc oxide. Preferably, these layers contain at least 50 wt.-% ZnO, more preferably at least 70 wt.-% ZnO, in particular at least 90 wt.-% ZnO. The layer containing ZnO can be amorphous, partially crystalline or crystalline, preferably it is crystalline. The at least two layers containing ZnO can have the same thickness or different thicknesses, preferably they have the same thickness. The layer containing ZnO preferably has a thickness of 0.1 to 100 nm, more preferably 1 to 10 nm, in particular 2 to 5 nm. Preferably, the layer containing ZnO has a uniform thickness, which means that the thickness at the thickest position of the layer is less than double of the thickness at the thinnest position, more preferably less than 1.5 the thickness at the thinnest position. The film according to the present invention comprises at least two layers containing ZnO, preferably at least three, more preferably at least five, in particular at least ten.

The second laminate further comprises a layer containing an organic compound. If the film comprises more than two layers containing ZnO, the film preferably comprises alternatingly a layer containing ZnO and a layer containing an organic compound, such that each layer containing an organic molecule is in between two layers containing ZnO, wherein other layers may be in between these layers. The layer containing an organic compound is preferably thinner than the layer containing ZnO. If more than one layer containing an organic compound is present, they can have the same thickness or a different one, preferably they have the same thickness. The layer containing an organic compound preferably has a thickness of 0.05 to 5 nm, more preferably 0.1 to 1 nm. The layer containing an organic compound can be a monolayer, i.e. having a thickness on the order of one molecule, or a sub-monolayer.

The same definitions and preferred embodiments for the organic compound in the first laminate apply to the second laminate. The organic compound in the first laminate can be the same organic compound as in the second laminate or it can be different, preferably it is the same.

The second laminate further comprises a metallic dopant other than zinc. The metallic dopant can be Li, Be, Na, Mg, Al, K, Ca, Sc, Ti, V, Cr, Mn, Fe, Co, Ni, Cu, Ga, Rb, Sr, Y, Zr, Nb, Mo, Tc, Ru, Rh, Pd, Ag, Cd, In Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, TI, Bi. Preferably, the metallic dopant is Mo, Ta, In, V, Sn, W, Mn, Al, Ga, Ti, Zr, or Hf, in particular Al. The film can contain one metallic dopant other than zinc or more than one, for example two or three.

The film typically contains less metallic dopant than zinc. Preferably the atomic ratio of the metallic dopant and zinc is $10^{-10}$ to 0.1, more preferably $10^{-9}$ to 0.01, in particular $10^{-8}$ to $10^{-3}$. There is no particular restriction to where the metallic dopant is placed as it is believed that at least part of the metallic dopant can migrate in the film. However, preferably the concentration of metallic dopant is highest at the interface between the layers containing zinc oxide and the layers containing an organic compound.

It is possible that there are other layers in between the metal layer and the second laminate. Preferably, however, the metal layer is in contact with the second laminate. Hence, the metal layer is usually in between the first and the second laminate, preferably it is in between the first and the second laminate and in direct contact with the first and the second laminate. The thickness of the second laminate is preferably 10 to 100 nm, more preferably 20 to 80 nm, in particular 30 to 60 nm, for example 35 to 50 nm.

The film preferably comprises a substrate, in particular a transparent substrate. The substrate preferably faces the first laminate, in particular the first laminate is in contact with the substrate. Various transparent substrates can be used, such as glass or polymers. Polymers are preferred. Polymers include polyesters such as polyethylene terephthalate (PET) or polyethylene naphthalene-dicarboxylic acid (PEN); polyimides; polyacrylates such as poly methyl methacrylate (PMMA); polyacrylamides; polycarbonates such as poly(bisphenol A carbonate); polyvinylalcohol and its derivatives like polyvinyl acetate or polyvinyl butyral; polyvinylchloride; polyolefins such as polyethylene (PE) or polypropylene (PP); polycycloolefins such as polynorbornene; polyethersulphone; polyamides like polycaprolactam or poly(hexamethylene adipic amide); cellulose derivatives such as hydroxyethyl cellulose, hydroxypropyl cellulose, methyl cellulose, methyl hydroxylpropyl cellulose or nitrocellulose; polyurethanes; epoxy resins; melamine formaldehyde resins; phenol formaldehyde resins. Polymers include copolymers such as poly(ethylene-co-norbornene) or poly(ethylene-co-vinylacetate). Polyesters and polycycloolefins are preferred.

The substrate can have any size and shape. Preferably the substrate is a film. The thickness of the substrate film depends on the application. If the barrier film is bent around a radius of more than 10 mm, the substrate film preferably has a thickness of 100 to 1000 μm, more preferably 100 to 500 µm, for example 100 to 200 µm. If the barrier film is bent with a radius of less than 10 mm the substrate film preferably has a thickness of 1 to 100 µm, more preferably 10 to 70 µm, such as 40 to 60 µm.

The surface of the substrate is preferably of high planarity. High planarity in the context of the present invention means that the highest point on the surface is not more than 100 nm higher than the lowest point on the surface, preferably not more than 50 nm. The planarity can be measured with atomic force microscopy, preferably in tapping mode.

Substrates are often not available with high planarity, e.g. due to small scratches, or particles such as dust adhered to their surface. It is therefore preferred that the barrier film further comprises a planarization layer to avoid damaging such as puncturing the laminate. More preferably the planarization layer is in between the substrate and the laminate. In this case the planarization layer can additionally serve to better hold together the substrate and the laminate, particularly upon bending or heating. Planarization layers can comprise organic polymers such as acrylates or epoxy, ceramics such as carbides, e.g. SiC, or organic-inorganic hybrid materials such as polyalkylsiloxanes. Organic polymers are preferred.

Often the planarization layer is made by depositing the material making up the planarization layer on the substrate before applying the laminate. In the case of organic polymers a liquid comprising a monomer is cast on the substrate and then cured, for example by heating or by UV initiation. UV initiation is preferred, more preferably the liquid comprising the monomer further comprises a curing aid such as a functionalized benzophenone. Preferably the liquid comprising the monomer comprises a mixture of mono- and difunctional monomers such that cross-linked organic polymers are obtained after curing. Planarization layers comprising ceramics are usually obtained by sputtering the material onto the substrate. Planarization layers comprising organic-inorganic hybrid materials can be obtained by casting a solution comprising an organic-inorganic precursor on the substrate, evaporating the solvent and condensing the organic-inorganic precursor, for example by heating. This process is often referred to as sol-gel process. An example for an organic-inorganic precursor is alkyl-trialkoxysilane. Preferably the precursor is functionalized with a UV curable side group, for example acrylate. In this way the organic-inorganic hybrid material can be cross-linked.

Preferably the material making up the planarization layer has a modulus of elasticity in between that of the substrate material and that of the laminate, for example 10 to 30 GPa. The method of determining the modulus of elasticity is described in ISO 527-1 (Plastics—Determination of tensile properties, 2012).

The film according to the present invention is particularly insensitive towards mechanical stress or strain. Preferably, the sheet resistance of the film increases by less than 50% after bending the film for 500 times around a radius of 0.5 cm.

The film according to the present invention can be made in various ways. The layers can be deposited from solution or from vapor. Vapor deposition methods are preferred. Such methods include chemical vapor deposition (CVD), thermal evaporation, sputtering, or atomic layer deposition (ALD). It is also possible to combine different methods, for example by depositing certain layers with one method and other layers with a different method. ALD is preferred for the deposition of the first and the second laminate. Thermal evaporation, sputtering and ALD is preferred for the metal layer, in particular thermal evaporation. For the sake of simplicity, ALD in the context of the present invention comprises both atomic layer deposition as well as molecular layer deposition or mixtures thereof.

Typical pressures at which the process is performed range from 1500 to $10^{-5}$ mbar, preferably from 100 to $10^{-3}$ mbar, more preferably from 10 to 0.1 mbar. It is therefore preferable to run the process in an apparatus in which the pressure can be adjusted such as in a vacuum chamber. The temperature for the process is in the range of −20 to 500° C., preferably 0 to 300° C., in particular 50 to 220° C.

For depositing the layer containing $TiO_2$, $ZrO_2$ or $HfO_2$ various Ti-, Zr-, or Hf-containing compounds can be used. Preferably, metal-organic metal-containing compounds are used, such as alkyl metals; metal alkoxylates such as tetra-isopropoxy zirconium; cyclopentadiene adducts like titanocene; metal carbenes; metal halides such as titanium tetrachloride; carbon monoxide complexes. Metal halides are preferred, in particular chlorides.

For depositing the layer containing ZnO various zinc-containing compounds can be used. Preferably, metal-organic zinc-containing compounds are used, such as alkyl zinc such as dimethyl zinc; zinc alkoxylates such as dimethoxy zinc; cyclopentadiene adducts like zincocene; zinc carbenes such as zinc N,N'-dimethylimidazol-2-ylidene; zinc halide such as zinc chloride. More preferably, the zinc-containing compound is an alkyl zinc, in particular a C1 to C4 alkyl zinc.

The deposited zinc-containing compound often has to be converted into zinc oxide. This can be achieved by heating above the decomposition temperature of the zinc-containing compound, preferably in the presence of an oxygen. Preferably, the deposited zinc-containing compound is decomposed by bringing it in contact with oxygen-containing compound, for example water, oxygen, ozone, or an oxygen plasma.

If the layer containing ZnO is made by ALD, preferably a sequence comprising depositing a zinc-containing compound and depositing it by bringing it in contact with an oxygen-containing compound is performed at least once, preferably at least five times, more preferably at least 10 times, in particular at least 20 times. Often, the sequence is performed for not more than 1000 times.

For depositing the layer containing an organic compound, the compounds described above can preferably be used. Preferably, the organic compound is deposited on deposited metal-organic compounds. However, if the organic compound is deposited on the layer containing zinc oxide, the surface of the layer containing zinc oxide is reactive, for example due to deposited zinc-containing compound which has not yet been brought in contact with an oxygen-containing compound.

Preferably the process for preparing the second laminate comprises the sequence comprising depositing a layer containing zinc oxide, depositing a layer containing an organic compound and depositing a metallic dopant other than zinc, wherein the sequence is performed once or preferably more than once, such as at least twice, at least three time, at least five times or in particular at least ten times, and then depositing another layer containing zinc oxide. Said sequence can have the order of
   (1) depositing a layer containing zinc oxide
   (2) depositing a layer containing an organic compound and
   (3) depositing a metallic dopant other than zinc.

Alternatively, said sequence can have the order of
   (1) depositing a layer containing zinc oxide
   (2) depositing a metallic dopant other than zinc, and (3) depositing a layer containing an organic compound.

Said sequence can comprise depositing a metallic dopant other than zinc twice, for example in the following order
  (1) depositing a layer containing zinc oxide
  (2) depositing a metallic dopant other than zinc,
  (3) depositing a layer containing an organic compound, and
  (4) depositing a metallic dopant other than zinc.

If the process is an ALD process, typically, the surface is exposed to the zinc-containing compound or the organic compound in one ALD cycle for 1 ms to 30 s, preferably 10 ms to 5 s, in particular 50 ms to 1 s. It is preferable to purge the substrate with an inert gas in between exposing the surface to the (semi)metal-containing compound or the sulfur-containing compound of different chemical structure, normally for 0.1 s to 10 min, preferably for 1 s to 3 min, in particular for 10 s to 1 min.

Preferably, the process according to the present invention is performed as a spatial ALD process, i.e. the zinc-containing compound, the metal-containing compound, the organic compound, and oxygen-containing compound are passed through separate orifices which are moved relative to the substrate This means that either the substrate is moved and the orifices are kept immobile or the substrate is kept immobile while the orifices are moved or both the substrate and the orifices are moved. Preferably the speed of motion is from 0.01 to 10 m/s, more preferably 0.02 to 1 m/s, in particular 0.05 to 0.3 m/s. The orifices are arranged such that the zinc-containing compound, the metal-containing compound, the oxygen-containing compound and the organic compound hit the surface of the substrate in the order as described for the process above. In order to avoid reactions in the gas phase it is preferred to place orifices through which an inert gas, such as nitrogen or argon, are passed towards the surface of the substrate between the orifices through which the zinc-containing compound, the metal-containing compound, the oxygen-containing compound and the organic compound is passed.

Preferably the orifices are mounted on a rotating drum around which the substrate is placed, preferably moved. Such an apparatus is described in WO 2011/099 858 A1. In case the substrate is flexible an organic-inorganic substrate can thus be deposited on a large substrate in a so-called roll-to-roll process.

The film according to the present invention can be used as electrode in an opto-electronic device. Examples for opto-electronic devices include light-emitting diodes, lasers, solar-cells, or optical sensors.

EXAMPLES

Substrate Preparation

Polymer film substrates were cut from polyethylene terephtalate (PET) films (thickness: 125 μm). PET polymer film substrates were cleaned with acetone, ethanol, de-ionized water, and blow-dried with nitrogen to remove contaminants.

Characterization

The thickness of layers containing zinc oxide were measured using spectroscopic ellipsometer (FS-1 multi-wavelength ellipsometer, Film Sense). The film morphology was investigated by atomic force microscopy (AFM, XE-100). The conductivity of the films was measured using four-point-probe technique (HP4155C, Agilent Technologies). UV-visible spectra were obtained using UV-VIS spectrometer (UV-VIS 8453, Agilent Technologies).

Example 1 (Comparative)

$TiO_2$ was deposited onto PET substrates using titanium (IV) chloride ($TiCl_4$) and de-ionized water ($H_2O$) as ALD precursors. Argon (Ar) served as both a carrier and a purging gas. The DEZ and $H_2O$ were evaporated at 20° C. The cycle consisted of 1 s exposure to DEZ, 5 s Ar purge, 1 s exposure to $H_2O$ and 5 s Ar purge. The total flow rate of Ar was 100 sccm. During this procedure, the temperature was kept at 100° C. under the pressure at 400 mbar. The cycle is performed for 875 times yielding a $TiO_2$ film of 35 nm thickness.

An Ag layer was deposited on the $TiO_2$ film by thermal evaporation.

Zinc oxide containing layers were deposited onto the Ag layer using diethylzinc (DEZ) and de-ionized water ($H_2O$) as ALD precursors. Argon (Ar) served as both a carrier and a purging gas. The DEZ and $H_2O$ were evaporated at 20° C. The cycle consisted of 1 s exposure to DEZ, 5 s Ar purge, 1 s exposure to $H_2O$ and 5 s Ar purge. The total flow rate of Ar was 100 sccm. During this procedure, the temperature was kept at 100° C. under the pressure at 400 mbar. The growth rate of ZnO thin film by ALD method was 1.5 Å/cycle. The cycle is performed for 233 times.

Subsequently, a layer containing an organic compound is made using trimethyl aluminum (TMA, Sigma Aldrich: 99%) and 4-mercaptophenol (4MP, Sigma Aldrich: 97%) as precursors. The reaction temperature is lowered to 145° C. Ar served as both a carrier and a purging gas. The TMA and 4MP were evaporated at 20° C. and 80° C., respectively. The ALD cycle consisted of 1 s exposure to TMA, 5 s Ar purge, 5 s exposure to 4MP, 60 s Ar purge, 1 s exposure to TMA and 5 s Ar purge. This cycle was performed once.

Example 2 (Comparative)

On a PET substrate a $TiO_2$ film and a Ag film was deposited as in example 1. Zinc oxide containing layers were deposited onto the Ag layer using diethylzinc (DEZ) and de-ionized water ($H_2O$) as ALD precursors. Argon (Ar) served as both a carrier and a purging gas. The DEZ and $H_2O$ were evaporated at 20° C. The cycle consisted of 1 s exposure to DEZ, 5 s Ar purge, 1 s exposure to $H_2O$ and 5 s Ar purge. The total flow rate of Ar was 100 sccm. During this procedure, the temperature was kept at 100° C. under the pressure at 400 mbar. The growth rate of ZnO thin film by ALD method was 1.5 Å/cycle. The cycle is performed for 233 times.

Subsequently, a layer containing an organic compound is made using trimethyl aluminum (TMA, Sigma Aldrich: 99%) and 2,3-dimercapto-1-propanol (DMP, Sigma Aldrich: 98%) as precursors. The reaction temperature is lowered to 145° C. Ar served as both a carrier and a purging gas. The TMA and 4MP were evaporated at 20° C. and 80° C., respectively. The ALD cycle consisted of 1 s exposure to TMA, 5 s Ar purge, 5 s exposure to 4MP, 60 s Ar purge, 1 s exposure to TMA and 5 s Ar purge. This cycle was performed once.

The deposition process for the zinc oxide containing layer and the layer containing an organic compound as described before is alternatingly performed for 14 times yielding a second laminate with a thickness of 35 nm.

Example 3 (Inventive)

On a PET substrate a first laminate is made by first depositing $TiO_2$ layers using titanium(IV) chloride ($TiCl_4$)

and de-ionized water ($H_2O$) as ALD precursors. Argon (Ar) served as both a carrier and a purging gas. The DEZ and $H_2O$ were evaporated at 20° C. The cycle consisted of 1 s exposure to DEZ, 5 s Ar purge, 1 s exposure to $H_2O$ and 5 s Ar purge. The total flow rate of Ar was 100 sccm. During this procedure, the temperature was kept at 100° C. under the pressure at 400 mbar. The growth rate of $TiO_2$ thin film by ALD method was 1.5 Å/cycle. The cycle is performed for 266 times.

Subsequently, a layer containing an organic compound is made using titanium(IV) chloride ($TiCl_4$) and 2,3-di-mercapto-1-propanol (DMP, Sigma Aldrich: 98%) as precursors. The reaction temperature is lowered to 145° C. Ar served as both a carrier and a purging gas. The $TiCl_4$ and DMP were evaporated at 20° C. and 80° C., respectively. The ALD cycle consisted of 1 s exposure to $TiCl_4$, 5 s Ar purge, 5 s exposure to DMP, 60 s Ar purge, 1 s exposure to $TiCl_4$ and 5 s Ar purge. This cycle was performed once.

The deposition process for the $TiO_2$ containing layer and the layer containing an organic compound as described before was alternatingly performed for 7 times yielding a first laminate with a thickness of 19 nm.

On the first laminate, a Ag layer as in example 1 and a second laminate as in example 2 was deposited with the difference that the second laminate had a thickness of 40 nm because the zinc oxide containing layer and the layer containing an organic compound as described before is alternatingly performed for 16 times.

Example 4 (Inventive)

Example 3 was repeated with the first difference that the first laminate had a thickness of 24 nm because the deposition of the $TiO_2$ containing layer and the layer containing an organic compound as described before was alternatingly performed for 11 times. The second difference is that the second laminate had a thickness of 45 nm because the zinc oxide containing layer and the layer containing an organic compound as described before is alternatingly performed for 18 times.

Sheet Resistance

The sheet resistance of the films obtained in the examples 1 to 4 were measured after deposition, after bending 500 times and 1000 times around a radius of 0.5 cm.

| Example | Initial Sheet Resistance in Ω/sq | Sheet Resistance (500 times bending) in Ω/sq | Sheet Resistance (1000 times bending) in Ω/sq |
|---|---|---|---|
| 1 | 25 | 647 | 4892 |
| 2 | 20 | 326 | 2890 |
| 3 | 23 | 35 | 245 |
| 4 | 21 | 29 | 95 |

The invention claimed is:

1. A transparent conductive film comprising
   (a) a first laminate comprising
      at least two layers containing $TiO_2$, $ZrO_2$ or $HfO_2$, and
      a layer containing a sulfur-containing organic compound in between the two layers containing $TiO_2$, $ZrO_2$ or $HfO_2$,
   wherein each layer containing a sulfur-containing organic compound is in between two layers containing $TiO_2$, $ZrO_2$ or $HfO_2$,
   wherein the layers containing $TiO_2$, $ZrO_2$ or $HfO_2$ each have a thickness of 0.1 to 5 nm,
   (b) a metal layer, and
   (c) a second laminate comprising
      at least two layers containing ZnO,
      a layer containing a sulfur-containing organic compound between the two layers containing ZnO, and
      a metallic dopant other than zinc,
   wherein each layer containing a sulfur-containing organic compound is in between two layers containing ZnO,
   wherein the layers containing ZnO each have a thickness of 0.1 to 5 nm,
   wherein the metal layer is between the first and the second laminate;
   wherein a sheet resistance of the film increases by less than 10% after bending the film for 500 times around a radius of 1 cm.

2. The transparent conductive film according to claim 1, wherein the metal layer contains Al, Cu, Ag, or Au.

3. The transparent conductive film according to claim 1, wherein the metal layer has a thickness of 3 to 30 nm.

4. The transparent conductive film according to claim 3, wherein the sulfur-containing organic compound is an organic thiol.

5. The transparent conductive film according to claim 1, wherein the first laminate has a thickness of 5 to 40 nm.

6. The transparent conductive film according to claim 1, wherein the film further comprises a transparent flexible substrate.

7. The transparent conductive film according to claim 1, wherein the film has a sheet resistance of 200Ω/sq or less.

8. The transparent conductive film according to claim 1, wherein the film has a resistivity of 0.02 Ω·cm or less.

9. A method of using the film according to claim 1, the method comprising using the film as an electrode in an opto-electronic device.

10. A process for preparing a transparent conductive film comprising depositing on a substrate
   (a) a first laminate comprising
      at least two layers containing $TiO_2$, $ZrO_2$ or $HfO_2$, and
      a layer containing a sulfur-containing organic compound in between the two layers containing $TiO_2$, $ZrO_2$ or $HfO_2$,
   wherein each layer containing a sulfur-containing organic compound is in between two layers containing $TiO_2$, $ZrO_2$ or $HfO_2$,
   wherein the layers containing $TiO_2$, $ZrO_2$ or $HfO_2$ each have a thickness of 0.1 to 5 nm,
   (b) a metal layer, and
   (c) a second laminate comprising
      at least two layers containing ZnO,
   wherein the layers containing ZnO each have a thickness of 0.1 to 5 nm,
      a layer containing a sulfur-containing organic compound between the two layers containing ZnO, and
      a metallic dopant other than zinc,
   wherein each layer containing a sulfur-containing organic compound is in between two layers containing ZnO,
   wherein the metal layer is between the first and the second laminate;
   wherein a sheet resistance of the film increases by less than 10% after bending the film for 500 times around a radius of 1 cm.

11. The process according to claim 10, wherein the deposition is performed by atomic layer deposition.

12. The process according to claim 10, wherein the deposition is performed at a temperature of 100 to 220° C.

* * * * *